US 6,482,753 B1

(12) United States Patent
Tometsuka

(10) Patent No.: US 6,482,753 B1
(45) Date of Patent: Nov. 19, 2002

(54) SUBSTRATE PROCESSING APPARATUS AND METHOD FOR MANUFACTURING SEMICONDUCTOR DEVICE

(75) Inventor: Kouji Tometsuka, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/095,072

(22) Filed: Mar. 12, 2002

(30) Foreign Application Priority Data

May 10, 2001 (JP) ........................................ 2001-139542

(51) Int. Cl.⁷ ........................ H01L 21/31; H01L 21/469; C23C 16/00
(52) U.S. Cl. ........................ 438/758; 438/680; 438/681; 118/715; 118/724; 427/585
(58) Field of Search ................................ 438/758, 680, 438/681; 118/715, 724, 725; 427/585, 255.28

(56) References Cited

U.S. PATENT DOCUMENTS 5,322,813 A * 6/1994 Beach ............................ 437/88
5,458,685 A * 10/1995 Hasebe et al. ................ 118/724
5,534,079 A * 7/1996 Beach ............................ 148/33
6,025,243 A * 2/2000 Ohmi et al. ................... 438/347
6,086,952 A * 7/2000 Lang et al. ................ 427/255.29
6,142,773 A   11/2000 Shimazu

FOREIGN PATENT DOCUMENTS

EP          0 926 707 A2     6/1999

* cited by examiner

*Primary Examiner*—Alexander Ghyka
(74) *Attorney, Agent, or Firm*—Oliff & Berridge, PLC

(57) ABSTRACT

An apparatus and a method for manufacturing a semiconductor device can prevent formation of reaction by-products at a cooled metal flange, and can allow a maintenance period of an apparatus to become longer. A vertical CVD apparatus as a substrate processing apparatus for processing substrates W at a prescribed processing temperature comprises an outer reaction quartz tube 11 and an inner reaction quartz tube 12 provided concentrically. The outer tube 11 is vertically disposed via an O-ring 7 on an upper end of a metal flange 20. The inner tube 12 is vertically disposed on an inner wall of the flange 20. The O-ring 7 is cooled via the flange 20. A lower opening 16 of the flange 20 is covered with a furnace opening cover 32. The flange 20 is provided with a gas introducing nozzle 21 to allow a reaction gas to be introduced into the inner tube 12. The outer tube 11 is integrally provided with an exhaust opening 22 so that a high temperature exhaust gas can be exhausted from the exhaust opening 22 before passing through the flange 20.

5 Claims, 3 Drawing Sheets

SUBSTRATE PROCESSING APPARATUS AND METHOD FOR MANUFACTURING SEMICONDUCTOR DEVICE

BACKGROUND OF THE INVENTION

1. Field of the Invention

This invention relates to a substrate processing apparatus and a method for manufacturing a semiconductor device, and particularly to a substrate processing apparatus the lower structure of which is improved.

2. Description of the Related Art

A conventional substrate processing apparatus for performing a method for manufacturing a semiconductor device, for example, when taking a vertical CVD apparatus as an example and explaining with the use of a view for illustrating principal portions of FIG. 5, is as follows.

An outer reaction tube 1 is provided inside of a heater which is not shown in the drawing. Within the outer reaction tube 1, there is concentrically provided an inner reaction tube 2 for constructing a processing space 19 with an upper end being opened. The outer reaction tube 1 and the inner reaction tube 2 are vertically disposed on a flange 3. A lower end of the outer reaction tube 1 is sealed by an upper end of the flange 3 via an O-ring 17. A lower opening of the flange 3 is airtightly covered with a furnace opening cover 19 via an O-ring 18.

The flange 3 is provided with a coolant flow passage 5 that allows a cooling water for cooling the above-mentioned O-ring 17 to flow therethrough, and a periphery of the O-ring 17 is water-cooled. In addition, the furnace opening cover 19 is provided with a coolant flow passage 6 that allows a cooling water for cooling the above-mentioned O-ring 18 to flow therethrough, and the periphery of the O-ring 18 is water-cooled. A boat which is not shown in the drawing is vertically disposed on the furnace opening cover 19, and the boat is inserted into the inner reaction tube 2. In the boat, wafers to be processed are loaded being horizontally oriented in a multi-storied fashion.

The flange 3 is provided with an exhaust opening 4. This exhaust opening 4 communicates with a lower end of a cylindrical space 13 formed as an exhaust path between the outer reaction tube 1 and the inner reaction tube 2 and through the exhaust opening 4, interiors of the outer reaction tube 1 and the inner reaction tube 2 are exhausted. Moreover, the flange 3 is also designed to be provided with a gas introducing nozzle in such a way that a reaction gas is introduced into the inner reaction tube 2, which is not shown in the drawing.

The boat is moved down via the furnace opening cover 19 by a boat elevator which is not shown in the drawing, and wafers are loaded onto the boat, and then, the boat is inserted into the inner reaction tube 2 by the boat elevator. After the furnace opening cover 19 completely covers a lower end of the flange 3, the interiors of the outer reaction tube 1 and the inner reaction tube 2 are exhausted to a reduced pressure.

While supplying a reaction gas into the inner reaction tube 2 from the gas introducing nozzle, the reaction gas is exhausted from the exhaust opening 4. The interior of the inner reaction tube 2 is heated to a prescribed temperature, and a film is formed onto a surface of the wafers. After completing the film formation, an inert gas is introduced from the gas introducing nozzle so that the atmosphere inside of the outer reaction tube 1 and the inner reaction tube 2 is substituted for the inert gas, and then, the interiors of the outer and inner tubes 1 and 2 are returned to a normal pressure to draw out the boat.

In the mean time, in contrast to the above-mentioned CVD apparatus, a process, such as annealing, diffusion or oxidation, in a furnace of a substrate processing apparatus (hereafter referred to as a diffusion furnace and the like) is performed at a higher temperature (1000° C. or more). In addition, there are many devices wherein metal contamination should be avoided. For these reasons, a metal member can not be used inside of a furnace such as a diffusion furnace and the like. All of a reaction tube, a flange, a cover body and the like are typically formed of quartz without using a metal part.

On the other hand, a process in the CVD apparatus is performed at a lower temperature (about 600 to 750° C.) so that, even if a metal member is used in a furnace, a mulfunction is not caused to the extent as in the diffusion furnace and the like. Therefore, in general, metal such as stainless steel, aluminum alloy or the like which has more superior machinability and cost efficiency is used for the flange and the furnace opening cover while quartz is used for the outer reaction tube 1 and the inner reaction tube 2.

In this way, a metal member is used for some parts of the furnace in a vertical CVD apparatus, but a relation between the metal flange and an exhaust gas particularly causes a problem in this case. In the conventional vertical CVD apparatus, as mentioned above, the metal flange 3 is provided with the exhaust opening 4, and the outer reaction tube 1 and the metal flange 3 are sealed by the O-ring 17. As a material of the O-ring 17, there is generally used a fluororubber or the like which has durability and elasticity. In the case of fluororubber, when using this under a reduced pressure at a low temperature of about 600 to 750° C., a component such as water and the like is released by heating so that an organic contaminant referred to as degasification is generated. Therefore, the metal flange 3 is provided with the coolant flow passage 5 to allow cooling water to flow therethrough so that the periphery of the O-ring 17 is cooled.

However, when allowing cooling water to flow through the coolant flow passage 5 with which the metal flange 3 is provided in order to water-cool the O-ring 17, the entire metal flange 3 including the exhaust opening 4 becomes cooled, because the metal flange 3 formed integrally with the exhaust opening 4 is formed of metal such as stainless steel and the like. If the entire metal flange 3 has been cooled, the reaction gas is cooled by contact with the metal flange 3 when being exhausted from the exhaust opening 4 provided for the metal flange 3 so that reaction by-products adhere to a metal flange inner wall. Many of the reaction by-products adhere particularly to the vicinity of the exhaust opening 4. The reaction by-products which have adhered peel off to be particles which contaminate the reaction atmosphere so that there is a fear of adherence of the particles onto the substrates. The adherence of the particles onto the substrates tends to become a cause of defects in a product (a semiconductor device).

Hence, in order to take measures against the by-products, an attempt to heat the portion of the metal flange 3 except the vicinity of the O-ring 17 has been made. However, a metal component is released from a metal surface by heating and an organic contaminant referred to as degasification is generated, which results in metal contamination. In CVD, metal contamination is undesirable, although the suppression of the metal contamination is not so required to the extent as in the diffusion furnace and the like. Therefore, a measure to heat a metal flange can not be adopted. As a result, it is impossible to effectively prevent the reaction by-products from adhering to the metal flange 3.

Thus, it is impossible to effectively prevent the reaction by-products from adhering to the inner wall of the metal portion due to the cooling phenomenon of the metal portion. As a result, in order to remove the reaction by-products, there has been a problem that a maintenance period of an apparatus becomes short.

SUMMARY OF THE INVENTION

An object of the present invention is to provide a substrate processing apparatus and a method for manufacturing a semiconductor device wherewith, by resolving the problems with the prior art noted in the foregoing, reaction by-products are less apt to adhere to a metal portion so that a maintenance period is long A first invention resides in a substrate processing apparatus comprising: a nonmetal reaction tube; a heater that heats an interior of the reaction tube to a prescribed processing temperature; a metal flange for disposing the reaction tube thereon, that constitutes a furnace opening of the reaction tube; a furnace opening cover for covering the furnace opening of the metal flange; a gas introducing opening provided for the metal flange, for introducing a reaction gas into the reaction tube; and an exhaust opening integrally provided for the reaction tube, for exhausting the interior of the reaction tube, wherein a substrate is processed in the reaction tube.

While being supplied into a reaction tube from a gas introducing opening, a reaction gas is exhausted from an exhaust opening. This exhaust opening is integrally provided for the reaction tube disposed on a metal flange. Accordingly, even if the metal flange is cooled, the reaction gas is exhausted before the reaction gas reaches the metal flange so that the reaction gas which remains in a high temperature state without being cooled by the metal flange is exhausted to an outside. As a result, it is possible to effectively prevent reaction by-products resulting from a cooling phenomenon from adhering to a periphery of the exhaust opening or an inner wall of the metal flange so that particles are not generated onto a substrate during processing the substrate.

In the above-mentioned invention, it is preferable that the prescribed processing temperature be from 600 to 750° C., and that the substrate be processed under a reduced pressure. A typical process for processing a substrate at a temperature from 600 to 750° C. under a reduced pressure includes a CVD process. In the case of performing a process at such temperatures, even if a metal member such as a metal flange and the like is used at a lower portion of an apparatus (a lower furnace portion), a problem of metal contamination does not arise because the temperature is low.

A second invention resides in a substrate processing apparatus comprising: a nonmetal reaction tube in which a substrate is processed; a gas introducing opening for introducing a reaction gas into the reaction tube; a heater that heats an interior of the reaction tube to a prescribed processing temperature; a metal flange for disposing the reaction tube thereon via an O-ring, that constitutes a furnace opening of the reaction tube; a furnace opening cover for covering the furnace opening of the metal flange; a coolant flow passage provided for the metal flange, that allows a cooling medium for cooling the O-ring to flow therethrough; and an exhaust opening integrally provided to the reaction tube, for exhausting the interior of the reaction tube, wherein a gas after processing the substrate in the reaction tube is exhausted from the exhaust opening before passing through the O-ring.

Since an exhaust opening is provided to a reaction tube itself disposed on a metal flange, a reaction gas is exhausted from the exhaust opening provided to the reaction tube before the reaction tube passes through an O-ring disposed between the reaction tube and the metal flange. Accordingly, the reaction gas which remains at a high temperature is exhausted from the exhaust opening without being cooled by contact with the metal flange which becomes cooled as the O-ring is cooled by flowing a cooling medium. As a result, it is possible to effectively prevent reaction by-products resulting from the cooling from adhering to a periphery of the exhaust opening or an inner wall of the metal flange.

A third invention reside in a method for manufacturing a semiconductor device, comprising forming a semiconductor device in a nonmetal reaction tube by using a substrate processing apparatus comprising: the nonmetal reaction tube; a heater that heats an interior of the reaction tube to a prescribed processing temperature; a metal flange for disposing the reaction tube thereon, that constitutes a furnace opening of the reaction tube; a furnace opening cover for covering the furnace opening of the metal flange; a gas introducing opening provided for the metal flange, for introducing a reaction gas into the reaction tube; and an exhaust opening integrally provided for the reaction tube, for exhausting the interior of the reaction tube.

A fourth invention resides in a method for manufacturing a semiconductor device, comprising forming a semiconductor device in a nonmetal reaction tube by using a substrate processing apparatus comprising: the nonmetal reaction tube in which a substrate is processed; a gas introducing opening for introducing a reaction gas into the reaction tube: a heater that heats an interior of the reaction tube to a prescribed processing temperature; a metal flange for disposing the reaction tube thereon via an O-ring, that constitutes a furnace opening of the reaction tube; a furnace opening cover for covering the furnace opening of the metal flange; a coolant flow passage provided for the metal flange, that allows a cooling medium for cooling the O-ring to flow therethrough; and an exhaust opening integrally provided for the reaction tube, for exhausting the interior of the reaction tube, wherein a gas after processing the substrate in the reaction tube is exhausted from the exhaust opening before passing through the O-ring.

According to the third and fourth inventions, since an exhaust opening is provided for a reaction tube disposed on a metal flange, a reaction gas is exhausted from the exhaust opening provided for the reaction tube before the reaction gas passes through an O-ring disposed between the reaction tube and the metal flange. Accordingly, the reaction gas which remains at a high temperature is exhausted from the exhaust opening without being cooled by contact with the metal flange which becomes cooled as the O-ring is cooled by allowing a cooling medium to flow. As a result, it is possible to effectively prevent reaction by-products resulting from the cooling from adhering to a periphery of the exhaust opening or an inner wall of the metal flange so that a high quality semiconductor device can be manufactured without any defects due to adherence of particles.

DESCRIPTION OF THE PREFERRED EMBODIMENTS

Embodiment of the present invention will be described below.

Figure 1:
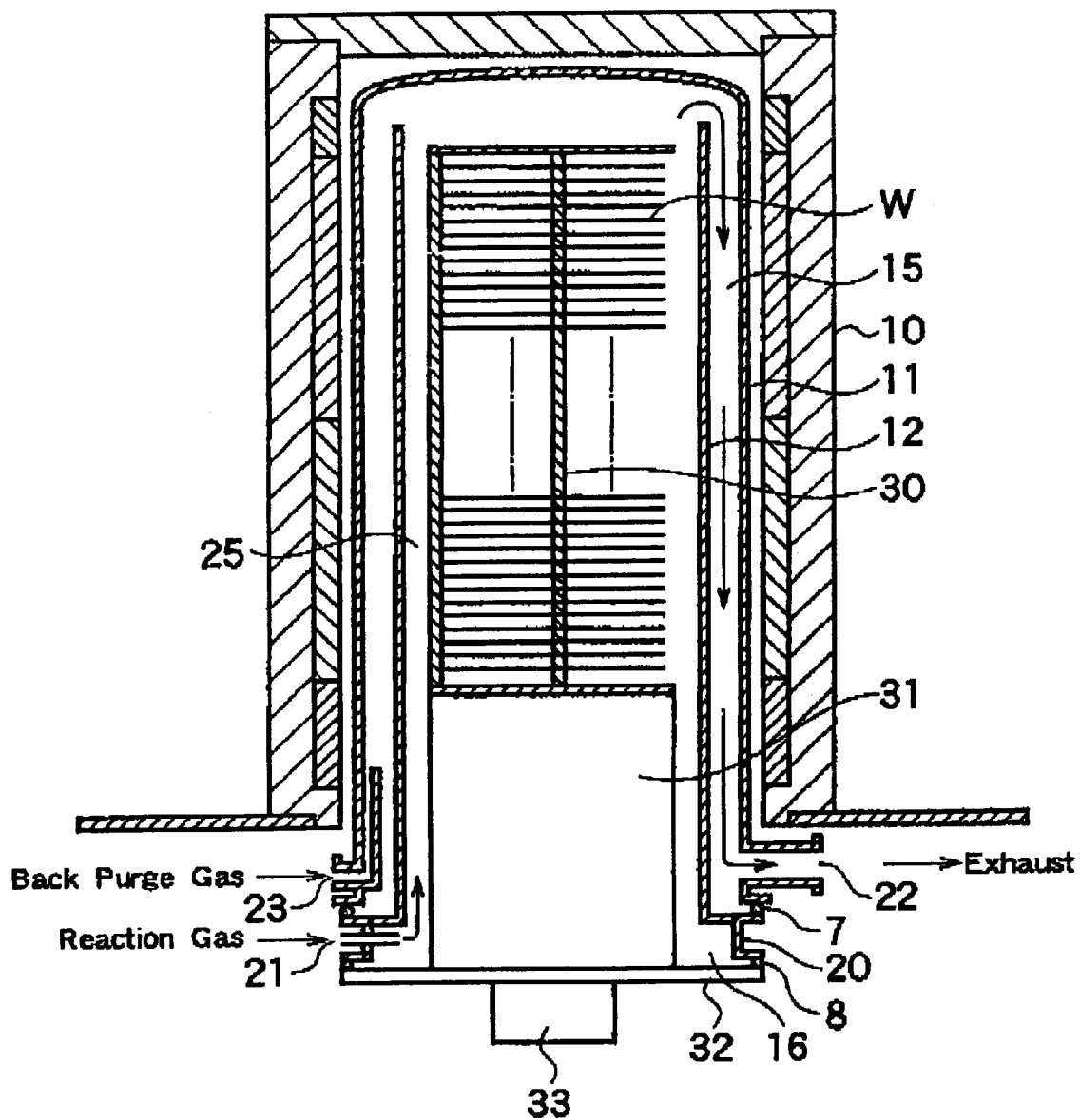
FIG. 1 is a schematic view for illustrating a construction of a vertical CVD apparatus adapted to be a semiconductor manufacturing apparatus for performing a method for manufacturing a semiconductor device according to the present invention.

FIG. 1 shows a schematic view of a construction of an embodiment of a vertical CVD apparatus adapted to be a semiconductor manufacturing apparatus for performing a method for manufacturing a semiconductor device.

Inside of a heater 10 Which is closed at its upper portion, there is provided a nonmetal outer reaction tube, for example, an outer reaction tube 11 made of quartz, and within the outer reaction tube 11, there is concentrically provided a nonmetal inner reaction tube with an upper end being opened, for example, an inner reaction tube 12 made of quartz. Within the inner reaction tube 12, there is constructed a processing space 25 in which wafers W are processed. The outer reaction tube 11 and the inner reaction tube 12 are vertically disposed on a metal flange 20, and the outer reaction tube 11 and the metal flange 20 are sealed therebetween by an O-ring 7. A lower end of the metal flange 20 is airtightly covered with a furnace opening cover 32 made of metal, for example made of stainless steel or aluminum alloy, via an O-ring 8. A boat 30 made of quartz which is vertically disposed on the furnace opening cover 32 via a cap 31 made of quartz, is inserted into the processing space 25 within the inner reaction tube 12. In the boat 30, wafers W as a substrate to be processed are loaded being horizontally oriented in a multi-storied fashion. The boat 30 is designed to rotate while the furnace opening cover 32 is not a rotatable system. Rotation of the boat 30 is performed by a boat rotation mechanism 33 which is attached to an outside of the furnace opening cover 32.

The reason why metal such as stainless steel and the like rather than quartz is used for a flange is that the flange is employed for a CVD apparatus which is operated at a relatively low temperature and that metal has a better sealing property and cost efficiency than quartz. In addition, the metal flange 20 is so easy to machine as to be easily connected to a reaction gas introducing nozzle 21 made of metal. Moreover, the metal flange 20 can sufficiently bear own weight of the inner reaction tube 12 and the outer reaction tube 11.

The reaction gas introducing nozzle 21 as a gas introducing opening is adapted to be provided at a peripheral wall portion of the metal flange 20 so that a reaction gas can be introduced into the processing space 25 within the inner reaction tube 12. In addition, an exhaust opening 22 is adapted to be integrally provided for the outer reaction tube 11 rather than for the metal flange 20 so as to exhaust interiors of the outer reaction tube 11 and the inner reaction tube 12. The exhaust opening 22 is provided at one side of a lower portion of the outer reaction tube 11 in such a way that the exhaust opening 22 is connected to a lower portion of a cylindrical space 15 formed between the outer reaction tube 11 and the inner reaction tube 12.

In this vertical CVD apparatus, with regard to a vertical relation between the exhaust opening 22 provided for the outer reaction tube 11 and the O-ring 7 for sealing the outer reaction tube 11 and the metal flange 20 therebetween, the exhaust opening 22 is located above the O-ring 7. Accordingly, the reaction gas which is exhausted downwardly in the cylindrical space 15 as indicated by arrows does not pass through either the metal flange 20 or the O-ring 7 so that the reaction gas can be exhausted before passing through the flange 20 and the O-ring-7.

Furthermore, a back purge gas introducing nozzle 23 is adapted to be provided at the other side of the lower portion of the outer reaction tube 11 so as to introduce a back purge gas into the outer reaction tube 11. Here, the exhaust opening 22 provided at the lower portion of the outer reaction tube 11 and the back purge gas introducing nozzle 23 are integrally formed with the outer reaction tube 11 with fused quartz. The metal flange 20 is made of, for example, stainless steel or aluminum alloy.

The furnace opening cover 32 is disposed on an underside of the cap 31. The furnace opening cover 32 is in intimate contact with a surface under an enlarged outer diameter of the metal flange 20 so that the furnace opening cover 32 airtightly seals via an O-ring 8 a lower opening 16 of the metal flange 20 that becomes a furnace opening. At an underside of this furnace opening cover 32 (outside of the processing space 25), there is provided a boat elevator board which is not shown in the drawing, and the boat 30 is inserted into or drawn out from the processing space 25 by allowing this boat elevator board to move up or down. The boat rotation mechanism 33 can rotate the boat 30 within a horizontal surface via the cap 31.

Figure 2:
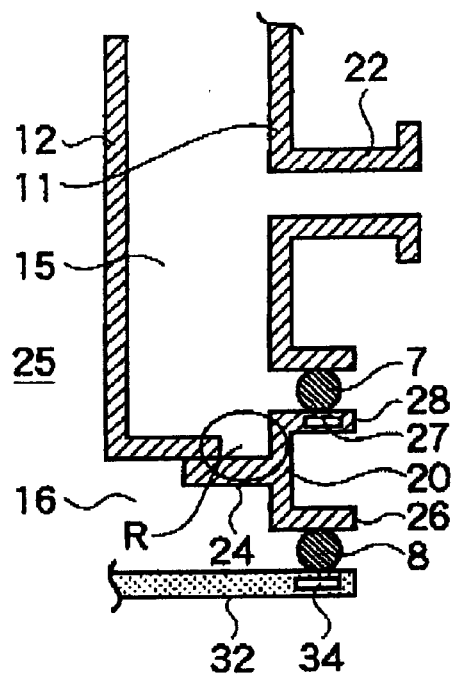
FIG. 2 is a view for illustrating detailed principal portions of a lower construction of a vertical CVD apparatus according to an embodiment.

FIG. 2 shows a view of detailed principal portions of a lower construction of the vertical CVD apparatus of FIG. 1. This view of the principal portions is a side sectional view illustrating a state in which the lower opening 16 of the metal flange 20 is covered with the furnace opening cover 32.

The exhaust opening 22 is integrally provided at the lower portion of the outer reaction tube 11. In addition, the outer reaction tube 11 provided integrally with this exhaust opening 22 is vertically disposed via the O-ring 7 on a horizontal flange portion 28 provided at an upper end of the metal flange 20.

On an inner peripheral wall of the metal flange 20, there is provided an annular convex portion 24 which extends radially inwardly from the inner wall, and the inner reaction tube 12 is vertically disposed on the annular convex portion 24. At a lower end of the metal flange 20, there is provided a horizontal flange portion 26, and at the same time, the outer diameter of the furnace opening cover 32 is set in accordance with the flange portion 26. The metal flange 20 and the furnace opening cover 32 are sealed therebetween via the O-ring 8.

The metal flange 20 is provided with a coolant flow passage 27 that allows a cooling water for cooling the above-mentioned O-ring 7 to flow therethrough, so that a periphery of the O-ring 7 is water-cooled. In addition, the furnace opening cover 32 is provided with a coolant flow passage 34 that allows a cooling water for cooling the above-mentioned O-ring 8 to flow therethrough, so that a periphery of the O-ring 8 is water-cooled.

The boat 30 is moved down by a boat elevator which is not shown in the drawing, and in the boat 30, wafers W are loaded being horizontally oriented in a multi-storied fashion, and then, the boat 30 is inserted into the processing space 25 within the inner reaction tube 12 by the boat elevator. After the furnace opening cover 32 completely covers a lower end of the metal flange 20 via the O-ring 8, the processing space 25 within the inner reaction tube 12 and the outer reaction tube 11 is exhausted to a reduced pressure. This exhaustion is performed with a vacuum pump (not shown in the drawing) which communicates with the exhaust opening 22.

A reaction gas is introduced through the reaction gas introducing nozzle 21 which is provided at the peripheral wall portion of the metal flange 20. The reaction gas for generating a required thin film includes $SiH_4$, $Si_2H_6$, $SiH_2Cl_2$, $NH_3$, $PH_3$, $N_2$ and the like. The reaction gas flows through the interior of the inner reaction tube 12 upwardly as indicated by an arrow, and then, the reaction gas flows through the space 15 between the outer reaction tube 11 and the inner reaction tube 12 downwardly as indicated by arrows so as to be exhausted through the exhaust opening 22 to the outside.

In this way, while supplying the reaction gas into the processing space 25 from the reaction gas introducing nozzle 21, the reaction gas is exhausted from the gas exhaust opening 22. The processing space 25 is heated by the heater 10 to 600 to 750° C. which is a wafer processing temperature, and then, a chemical vapor deposition is performed on the wafers W under a reduced pressure of 10 to 100 Pa to perform film formation of a semiconductor film such as nitride film and the like on the surface. After completing the film formation, an inert gas, for example, $N_2$ gas is introduced from the back purge gas introducing nozzle 23 so that the atmosphere inside of the reaction tubes 11 and 12 is substituted for the inert gas, and then, the interiors of the outer and inner tubes 11 and 12 are returned to a normal pressure. Next, the boat 30 is moved down to draw out the wafers W on which the film formation has been completed.

According to the embodiment. the outer reaction tube 11 made of quartz is integrally provided with the exhaust opening 22, in addition, the outer reaction tube 11 is connected to the metal flange 20 at a position below the exhaust opening 22 via the O-ring 7. Therefore, in contrast to the case where the outer reaction tube is connected at a position above the exhaust opening via the O-ring to the metal flange that is integrally provided with the exhaust opening 22, neither the exhaust opening 22 nor an exhaust path leading to the exhaust opening 22 can be cooled. As a result, it is possible to effectively prevent reaction by-products from adhering to a periphery of the exhaust opening 22 due to heating of the exhaust opening 22 by thermal conductivity from the processing space 25 within the wall of the outer reaction tube 11. Moreover, since the reaction by-products do Dot adhere to the periphery of the exhaust opening 22, there is no necessity to heat the metal flange for taking measures against the by-products. This can also avoid metal contamination due to bakeout of the metal surface.

Incidentally. the above-mentioned embodiment of FIG. 1 and FIG. 2 is constructed in such a way that the outer reaction tube 11 is supported by the upper end flange portion 28 of the metal flange 20 and that the inner reaction tube 12 is supported by the convex portion 24 of the metal flange 20. In this construction, a step which exposes a metal portion of the metal flange 20 is formed in the vicinity of the convex 24. that is, there is a fear of adherence of by-products to the step portion R, as indicated by a circle in FIG. 2. wherein the metal of the convex 24 at the bottom portion of the space 15 which is the exhaust path is exposed. If by-products containing a Cl component adheres to this portion, the Cl component captures metal ions so as to cause the metal to corrode. If the by-products in which the metal ions are incorporated peel off and are blown up, the by-products may lead to a cause of metal contamination.

Figure 3:
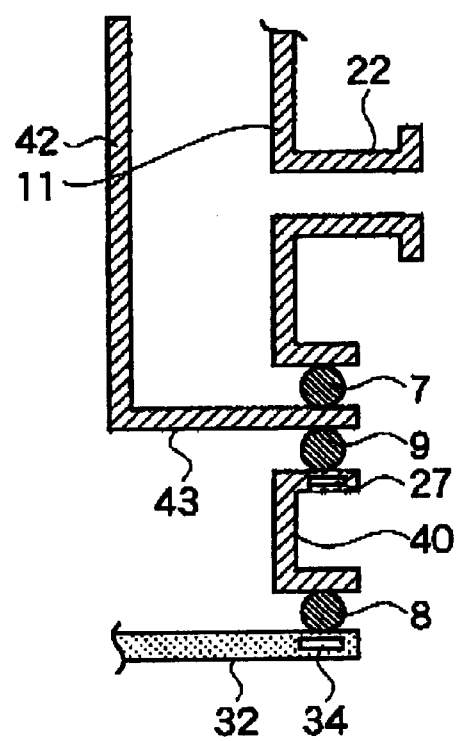
FIG. 3 is a view for illustrating detailed principal portions of a lower construction of a vertical CVD apparatus according to a modified example of an embodiment.

Accordingly, an embodiment as shown in FIG. 3 is designed in such a way that the outer reaction tube 11 is supported by an inner reaction tube 42 rather than by a metal flange 40 and that the metal flange 40 supports only the inner reaction tube 42 at an upper flange portion of the metal flange 40. That is, a flange 43 of the inner reaction tube 42 at a lower end of the inner reaction tube 42 is radially outwardly enlarged, and the outer reaction tube 11 is vertically disposed and supported via the O-ring 7 on the enlarged flange 43. In addition, the inner reaction tube 42 is adapted to be vertically disposed and supported via an O-ring 9 on a metal flange 40 to thereby allow the aforementioned step portion not to be generated. According to this, addition of only one O-ring 9 allows the space 15 being the exhaust path to be formed only by the outer reaction tube 11 which is made of quartz and the inner reaction tube 42 which is made of quartz, thereby exposing no metal surface to the space 15 so that no by-products can adhere to the periphery of the exhaust opening.

Figure 4:
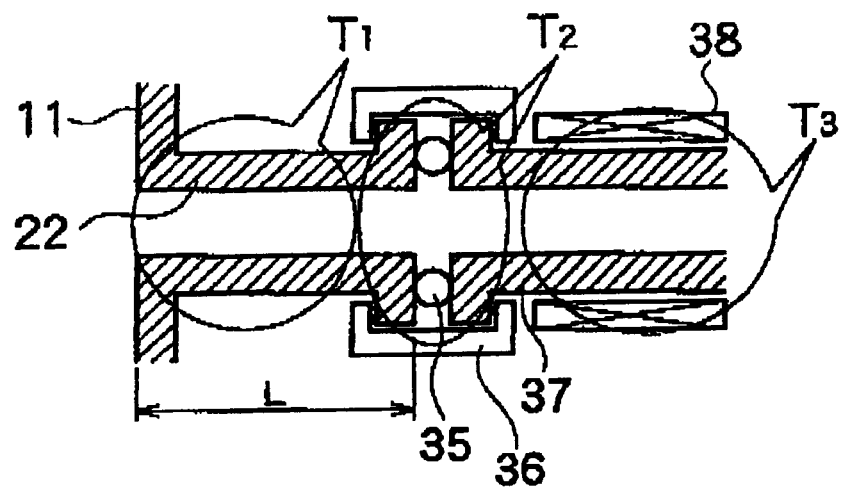
FIG. 4 is a view for illustrating a construction of an exhaust system according to an embodiment.
Figure 5:
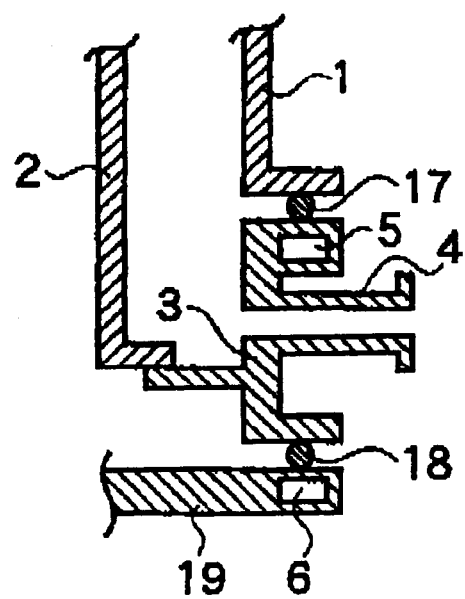
FIG. 5 is a view for illustrating detailed principal portions of a lower construction of a vertical CVD apparatus according to a conventional example.

In the mean time. a metal exhaust tube which leads to a vacuum pump is connected to the exhaust opening 22 with which the outer reaction tube 11 is integrally provided, and there may be a problem that reaction by-products adhere to the metal exhaust tube and the vicinity of the connecting portion. In this regard, an exhaust system of the present embodiment as shown in FIG. 4 comprises the exhaust opening 22 with which the outer reaction tube 11 is integrally provided, a metal pipe 37 leading to a vacuum pump, an O-ring 35 being located between the flanges of the exhaust opening 22 and the metal pipe 37, a clamp 36 for clamping the flanges together, and a heater 38 for heating the metal pipe 37.

A lower limit temperature at which no by-products adhere is about 150° C. As mentioned above, the exhaust opening 22 is heated to the extent of the end flange of the exhaust opening 22 by heat which transfers along the inner wall of the outer reaction tube 11 so that the end flange is maintained at a temperature at which no by-products adhere. This temperature is about $T_1$=400° C. If the metal pipe 11 is maintained at about $T_3$=150° C. with the heater 38, the connecting portion in which the O-ring 35 is located can be maintained at about $T_2$=200° C. Accordingly. no reaction by-products adhere to the metal pipe 11 and the connecting portion connected to the exhaust opening 22, not to mention the exhaust opening 22. If the exhaust opening 22 is too long, it is difficult to maintain the end side of the exhaust opening 22 at a temperature at which no reaction by-products adhere. A length L of the exhaust opening 22 wherein the by-products are difficult to adhere is about 200 mm.

As mentioned above, according to the present embodiments, in a vertical CVD apparatus in which a CVD film is formed on wafers under a reduced pressure, an outer reaction tube which is made of quartz is integrally provided with an exhaust opening to thereby minimize exposure of a metal part to an exhaust path or to thereby result in no exposure of the metal part to the exhaust path. Accordingly, when generating a semiconductor film on wafers, adherence of by-products to the metal part can be reduced to thereby allow particle generation and metal contamination resulting from by-products peeling off to be substantially reduced so that a high quality semiconductor device can be manufactured. Moreover, the integration of the exhaust opening with the outer reaction tube is easily performed with fused quartz so that a high quality semiconductor device can be manufactured at low cost.

In addition, the present invention which is applicable to general film formation via a vapor phase reaction is particularly effective in taking measures against reaction by-products during film formation of an SiN film and a TEOS film particularly because an exhaust gas which has the property of solidifying when cooled at a temperature of 100° C. or less can be exhausted without cooling.

Moreover, in the above explanation, the case has been explained in which the present invention is applied to a substrate processing apparatus having a reaction tube made of quartz as a nonmetal reaction tube. However, the present invention can also be applied to a substrate processing apparatus having a reaction tube made of nonmetal but quartz.

According to the present invention, adherence of reaction by-products to a metal flange can be effectively prevented, and particle generation and metal contamination can be reduced. Accordingly, a high quality semiconductor device can be manufactured with long-term stability, and a maintenance period of an apparatus can be longer.

What is claimed is:

1. A substrate processing apparatus comprising:
   a nonmetal reaction tube;
   a heater that heats an interior of said reaction tube to a prescribed processing temperature;
   a metal flange for disposing said reaction tube thereon;
   a furnace opening cover for covering a lower opening of said metal flange;
   a gas introducing opening provided for said metal flange, for introducing a reaction gas into said reaction tube; and
   an exhaust opening integrally provided for said reaction tube, for exhausting the interior of said reaction tube,
   wherein a substrate is processed in said reaction tube.

2. A substrate processing apparatus according to claim 1, wherein said prescribed processing temperature is from 600 to 750° C., and wherein said substrate is processed under a reduced pressure.

3. A substrate processing apparatus comprising:
   a nonmetal reaction tube in which a substrate is processed;
   a gas introducing opening for introducing a reaction gas into said reaction tube;
   a heater that heats an interior of said reaction tube to a prescribed processing temperature;
   a metal flange for disposing said reaction tube thereon via an O-ring;
   a furnace opening cover for covering a lower opening of said metal flange;
   a coolant flow passage provided for said metal flange, that allows a cooling medium for cooling said O-ring to flow therethrough; and
   an exhaust opening integrally provided for said reaction tube, for exhausting the interior of said reaction tube,
   wherein a gas after processing said substrate in said reaction tube is exhausted from said exhaust opening before passing through said O-ring.

4. A method for manufacturing a semiconductor device, comprising forming a semiconductor device in a nonmetal reaction tube by using a substrate processing apparatus comprising: said nonmetal reaction tube; a heater that heats an interior of said reaction tube to a prescribed processing temperature; a metal flange for disposing said reaction tube thereon; a furnace opening cover for covering a lower opening of said metal flange; a gas introducing opening provided for said metal flange, for introducing a reaction gas into said reaction tube; and an exhaust opening integrally provided for said reaction tube, for exhausting the interior of said reaction tube.

5. A method for manufacturing a semiconductor device, comprising forming a semiconductor device in a nonmetal reaction tube by using a substrate processing apparatus comprising: said nonmetal reaction tube in which a substrate is processed; a gas introducing opening for introducing a reaction gas into said reaction tube; a heater that heats an interior of said reaction tube to a prescribed processing temperature; a metal flange for disposing said reaction tube thereon via an O-ring; a furnace opening cover for covering a lower opening of said metal flange; a coolant flow passage provided for said metal flange, that allows a cooling medium for cooling said O-ring to flow therethrough; and an exhaust opening integrally provided for said reaction tube, for exhausting the interior of said reaction tube, wherein a gas after processing said substrate in said reaction tube is exhausted from said exhaust opening before passing through said O-ring.

* * * * *